United States Patent [19]

Wihl

[11] 4,236,937

[45] Dec. 2, 1980

[54] SOLAR COLLECTOR DEVICE

[75] Inventor: Manfred G. Wihl, Bethesda, Md.

[73] Assignee: Solarex Corporation, Rockville, Md.

[21] Appl. No.: 908,959

[22] Filed: May 24, 1978

[51] Int. Cl.² .......................................... H01L 31/04
[52] U.S. Cl. ..................................... 136/246; 136/244
[58] Field of Search ............ 136/89 P, 89 PC, 89 RT; 126/270, 271

[56] References Cited

U.S. PATENT DOCUMENTS

| | | | |
|---|---|---|---|
| 3,346,419 | 10/1967 | Webb et al. | 136/89 |
| 3,383,246 | 5/1968 | Ferreira | 136/89 |
| 3,433,676 | 3/1969 | Stein | 136/89 |

*Primary Examiner*—Aaron Weisstuch
*Attorney, Agent, or Firm*—Watson, Cole, Grindle & Watson

[57] ABSTRACT

A solar collector device such as a solar receiver or solar panel, the device including a substrate comprising a base member having a major surface including a plurality of generally planar platform areas, each platform area being in a different plane than adjacent platform areas, and at least one photovoltaic cell mounted on each of the platform areas, a portion of each of the cells extending beyond the platform area upon which it is mounted. The collector device tends to maximize the utilization of light received by the device.

6 Claims, 6 Drawing Figures

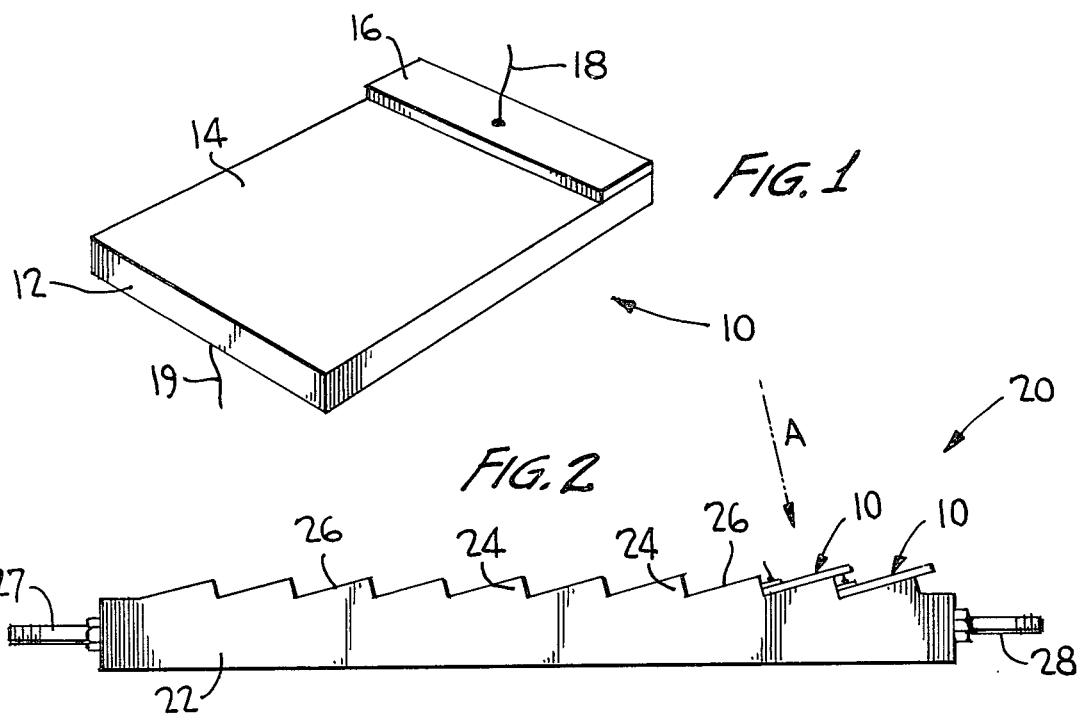
FIG. 1
FIG. 2
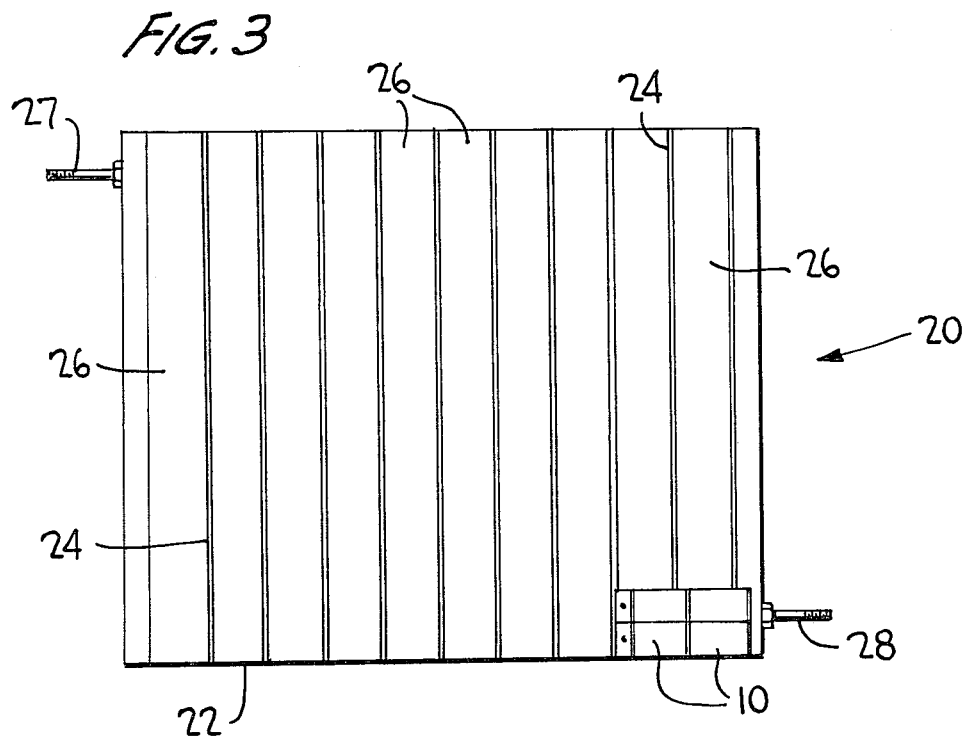
FIG. 3

SOLAR COLLECTOR DEVICE

BACKGROUND OF THE INVENTION

The present invention is directed generally to solar energy collector devices and is more particularly concerned with substrates for solar energy collector devices containing photovoltaic cells which are designed to maximize utilization of the incident light impinging upon such a collector by receiving essentially all of the light on an operable portion of a photovoltaic cell.

In the photovoltaic cell or solar cell art, the terms solar panel and solar receiver are used to describe devices including an array of interconnected solar cells, the former term being used when the device is adapted to receive incident light and the latter term being used when the device is adapted to receive light concentrated by mirrors, lenses and the like. As used herein, the term solar collector device encompasses both such device types.

Known solar collector devices are generally of the construction where an array of interconnected solar cells are mounted on a planar substrate, the light receiving surface of each cell being coplanar with adjacent cells. Since a significant portion of the light receiving surface of a conventional solar cell is occupied by the external electrical contacting area for the cell and that portion is unable to function in the manner of a photovoltaic cell, a significant percentage of the light receiving surface area of the collector device is consequently not capable of generating electrical energy from incident light. Especially in receiver type devices, this inoperable portion of the device constitutes a serious inefficiency in extracting all available energy from the light received by the collector device.

SUMMARY OF THE INVENTION

It is therefore an object of the present invention to provide a substrate adapted for use in a solar collector device so that the device tends to allow maximum utilization of the light received by the device.

Another object of the present invention is to provide a solar collector device which is capable of maximum utilization of light received by the device.

Briefly, the present invention comprehends a substrate adapted for use in a solar energy collector device, the substrate including a plurality of generally planar platform areas, each platform area being in a different plane than adjacent platform areas.

The present invention further comprehends a solar collector device including a substrate comprising a base member having a major surface including a plurality of generally planar platform areas, each platform area being in a different plane than adjacent platform areas, and at least one photovoltaic cell mounted on each of the platform areas, a portion of each of the cells extending beyond the platform area upon which it is mounted.

Further objects, advantages and features of the present invention will become more fully apparent from a detailed consideration of the arrangement and construction of the constituent parts as set forth in the following specification taken together with the accompanying drawing.

DESCRIPTION OF THE DRAWING

In the drawing, FIG. 1 is a perspective view of a typical conventional photovoltaic cell illustrating the light-receiving surface of the cell, FIG. 2 is a side view of one embodiment of a substrate in accordance with the present invention.

FIG. 3 is a top view of the substrate of FIG. 2 having a few interconnected solar cells mounted thereon.

DESCRIPTION OF THE PREFERRED EMBODIMENTS

Figure 4:
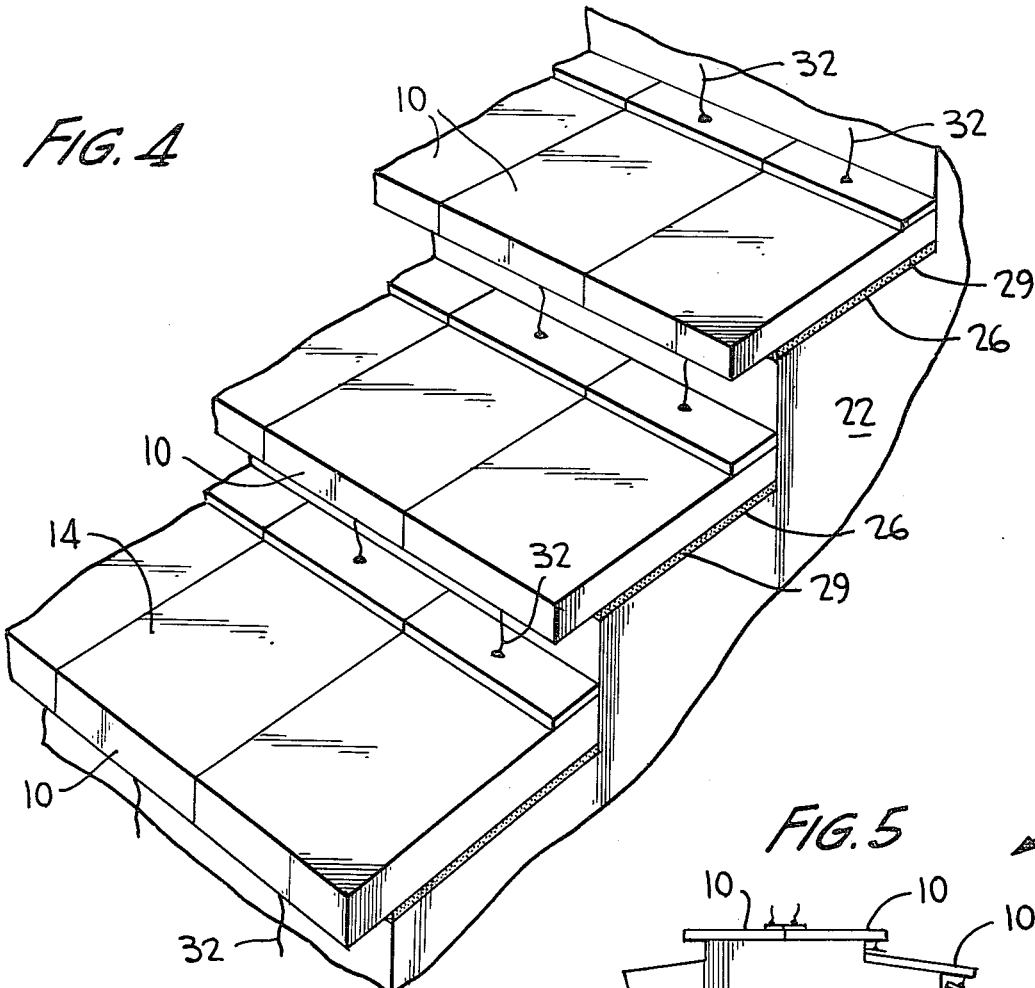
FIG. 4 is an enlarged perspective view of a portion of the substrate of FIGS. 2 and 3 showing the attached and interconnected solar cells.

Referring now to FIG. 1, shown in a typical conventional photovoltaic cell or solar cell 10 including a doped wafer 12 of silicon material. Wafer 12 is of p-type silicon, the top surface of light-receiving surface 14 having been diffused by an n-type impurity to form a p-n junction (not shown) within the wafer. On the top surface 14 of cell 10 is electrical contacting area 16 composed of a layer of metal, the area in electrical contact with n-type silicon portion of wafer 12. Electrical conductor 18 provides for the external electrical connection of top surface 14. Conductor 19 provides external electrical connection for the p-type silicon portion of wafer 12.

It should be realized that the above description of a solar cell 10 is given only for the purposes of explanation as the particular type or configuration of the solar cell used in the present invention is, of course, not critical and other types or configurations of cells are equally applicable.

Since a solar cell such as cell 10 illustrated in FIG. 1 normally produces a small voltage of up to about 0.5 volt under normal sunlight, it is common practice to provide an array of cells and electrically connect the cells either in series or parallel to respectively increase the voltage or current. As mentioned previously, such an array of cells has normally been formed by placing the cells adjacent to one another on a common planar substrate to provide a solar collector device.

A disadvantage of such an arrangement for a solar collector device, particularly when the collector device is to be used as a receiver device, is that the electrical contacting area of cell 10 significantly reduces the effective top surface area of the cell and thus limits the electrical generation capability of the collector.

The substrate of the present invention tends to alleviate or eliminate this disadvantage by providing operable solar cell surfaces over the entire solar energy receiving area of a collector device when the device is directed towards the sun. As is shown in FIGS. 2 and 3, preferred substrate 20 in accordance with the present invention comprises base member 22 having a plurality of triangular-shaped ridges 24 extending across a major surface of the substrate to provide a plurality of generally planar platform areas 26 in the form of parallel strips for the placement of solar cells 10 on the substrate. Each platform area 26 is in a plane different than adjacent platform areas and the planes of the platform areas are equally spaced from one another. As is evident from an examination of FIG. 2, solar cells 10 are to be placed on platform areas 26 on the left side of the ridges 24 of substrate 20 and therefore are adapted to receive light from the direction of arrow A approximately normal to the light-receiving surface of the cells.

When substrate 20 is used as a portion of a solar receiver, it is generally necessary to provide for cooling of cells 10 due to the thermal heat generated by the concentrated light. For this purpose, base member 22 has internal channels (not shown) through which a cooling medium such as water flows, the flow medium being provided by inlet 27 and outlet 28. To facilitate removal of heat from base member 22 by the medium, preferably the base member is of a good heat-conducting material such as a metal-containing material. Suitable metals for the substrate include copper, aluminum, alloys thereof, steel and the like.

Substrate 20 as shown need not have cooling means associated therewith, particularly if the substrate is to be used in a solar panel-type collector device. Furthermore, when used as a receiver-type device, separate rather than integral cooling means may be provided.

The arrangement and interconnection of solar cells 10 on substrate 20 is more clearly shown in FIG. 4. Here a plurality of cells 10 have been mounted on platform areas 26 of substrate 20 by layer 29 of adhesive material. An important feature of the present invention is that cells 10 are mounted on platform areas 26 such that each cell projects beyond the edge of the platform area. Thus, when substrate 20 is positioned such that the impinging light is normal to top surface 14 of each cell 10, the projecting portion of an adjacent cell receives light energy that would normally strike contacting area 16 of the cells if the cells were arranged in a conventional side-by-side relationship. As a consequence, when a collector device having substrate 20 in accordance with the present invention is viewed from a direction normal to the light-receiving surface 14 of cells 10, only operable portions of the cells are visible. Thus, the entire surface of the device which receives light is capable of functioning as a solar cell, and thereby the efficiency of the collector device per light intercepting area is increased.

Another feature of the present invention, as is shown in FIG. 4, is that the interconnection of adjacent cells 10 can be accomplished by electrical connectors 32 capable of relieving thermally induced stresses. These electrical wires or connectors 32 can take a wide variety of forms other than the wires shown such as tubes, U-shaped and looped wires, tabs and the like.

Interconnection between one descending row of cells 10 and the next adjacent row of cells on the substrate 20 so as to continue a series connection of cells may be accomplished in a number of fashions. For simplicity of assembly of a solar collector device utilizing substrate 20, adjacent descending rows of cells 10 may be slightly separated from one another and an electrical connector (not shown) passed through the channel formed between the rows of cells. Alternatively, electrical conductors (not shown) could pass through the interior of substrate 20 or about the periphery of the substrate.

Cells 10 may be attached to platform areas 26 by a variety of means, the only requirement being that the means be electrically insulating if the substrate is electrically conducting. For receiver-type collector devices, a good heat conducting, electrically insulating material such as a RTV silicone or epoxy adhesive is presently preferred.

While substrate 20 of the present invention has been described and shown as having a "stairstep" type appearance when viewed from the side, it is within the scope of the invention that the substrate could have other configurations which provide for a plurality of platform areas such that a solar cell on a particular platform area will extend over the inoperative portion of an adjacent cell. For example, the embodiment of FIG. 4 could be modified such that each cell has an individual platform area and thus the coplanar cells shown would instead be at a different elevation from each other. Furthermore, it is not necessary that each platform area be exactly planar. Grooves, surface irregularities, projections and the like may be provided on the platform areas to provide adherence of an adhesive. In addition, it may be desirable for some reason to utilize solar cells having a slightly non-planar bottom surface such as concave or convex and therefore the platform areas could be made to conform to the particular shape of the cell to facilitate heat transfer.

Figure 5:
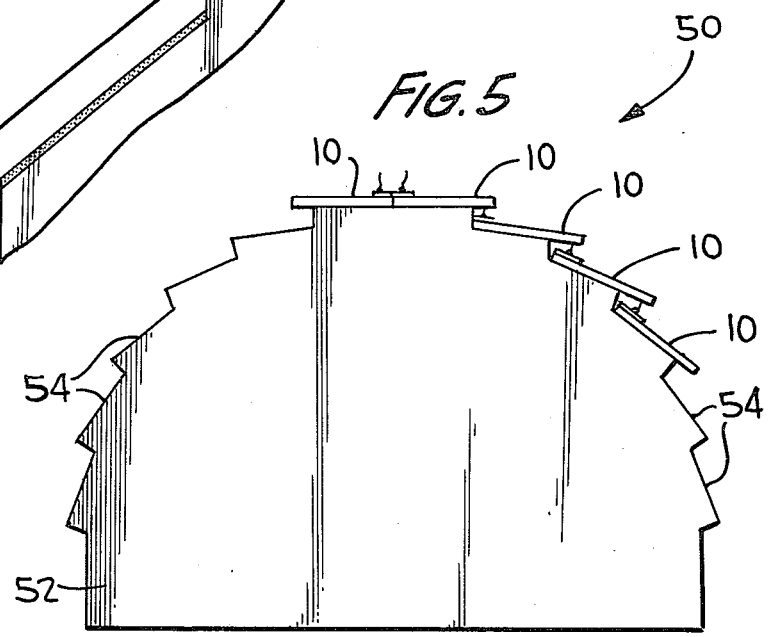
FIG. 5 is a side view of another embodiment of a substrate in accordance with the present invention.

FIG. 5 is a side view of another embodiment of a substrate in accordance with the present invention having several solar cells attached thereto. As is evident, substrate 50 includes base member 52 having a plurality of platform areas 54 adapted for the mounting of solar cells, the areas in doubly descending columns with adjacent areas of each column being in different planes. Thus, the overall appearance of the top surface of substrate 50 may be described as generally semicircular.

Figure 6:
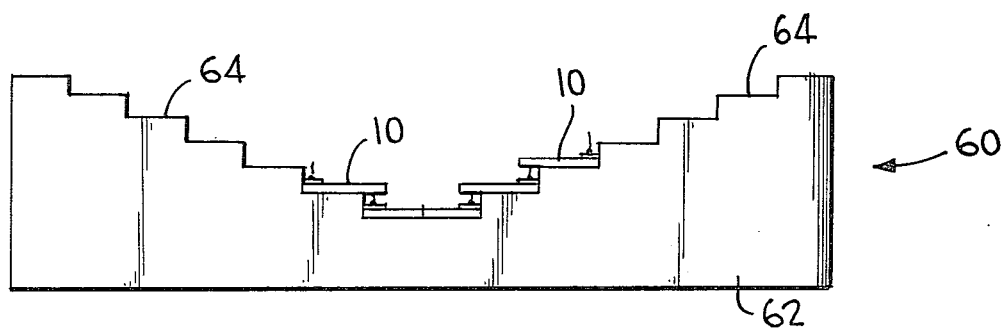
FIG. 6 is a side view of yet another embodiment of a substrate in accordance with the present invention.

FIG. 6 is a side view of another embodiment of a substrate in accordance with the present invention having several solar cells attached thereto. Substrate 60 includes base member 62 having a plurality of generally planar platform areas 64 adapted for attachment of solar cells, the areas in doubly descending columns with adjacent areas of each column being in different but parallel planes. The overall appearance of the top surface of substrate 60 may be described as generally concave. As is evident, substrate 60 is a combination of two substrates 20 of FIGS. 2 and 3 with a modified base member configuration for the lower portion.

While these latter embodiments are not quite as efficient as the embodiment shown in FIGS. 2 and 3 since some cells 10 mounted on the platform areas are fully exposed, substrate 50, for example, allows at least a portion of the cells mounted on the substrate to be normal to a light source (not shown) such as the sun at various positions of the light source relative to the substrate. However, when these substrates are utilized in receiver type devices, the associated optical system may dictate the need for such substrate configurations.

While there has been shown and described what is considered to be preferred embodiments of the present invention, it will be obvious to those skilled in the art that various changes and modifications may be made therein without departing from the invention as defined in the appended claims.

I claim:

1. A solar collector device which includes a substrate and at least one photovoltiac cell mounted on said substrate, said substrate comprising an elongated base member having a generally semi-circular cross-section and including a multiplicity of separate generally planar elongated platform areas formed in the curved periphery thereof so as to form doubly descending columns with adjacent areas of each column being in different planes, each said photovoltaic cell mounted on said substrate being mounted on one of said platform areas, and each said photovoltaic cell being of such a size as to tangentially extend beyond the platform area upon which it is mounted.

2. The solar collector device of claim 1 wherein said base member includes means therein for the passage of cooling fluid therethrough.

3. The solar collector device of claim 1 wherein said base member is made of a metal-containing material.

4. The solar collector device of claim 1 wherein the planes of said platform areas are equally spaced from one another.

5. The solar collector of claim 1 wherein photovoltaic cells are mounted on each separate platform area of said base member, each cell from one platform area including electrical connecting means for connecting it to a corresponding cell in an adjacent platform area.

6. The solar collector of claim 1 wherein photovoltaic cells are mounted in a side-by-side relationship along the elongated length of each separate platform area of said base member, each cell from one platform area including electrical connecting means for connecting it to a corresponding cell in an adjacent platform area.

* * * * *